United States Patent
Haft et al.

(10) Patent No.: US 7,072,795 B2
(45) Date of Patent: Jul. 4, 2006

(54) METHOD AND SYSTEM FOR MODELING A SYSTEM

(75) Inventors: Michael Haft, Zorneding (DE); Reimar Hofmann, Munich (DE); Volker Tresp, Munich (DE)

(73) Assignee: Panoratio Database Images GmbH, Munich (DE)

( * ) Notice: Subject to any disclaimer, the term of this patent is extended or adjusted under 35 U.S.C. 154(b) by 0 days.

(21) Appl. No.: 10/204,900

(22) PCT Filed: Dec. 21, 2000

(86) PCT No.: PCT/DE00/04607

§ 371 (c)(1),
(2), (4) Date: Oct. 22, 2002

(65) Prior Publication Data

US 2003/0115016 A1 Jun. 19, 2003

(30) Foreign Application Priority Data

Feb. 28, 2000 (DE) .......................... 100 09 344

(51) Int. Cl.
*G06F 19/00* (2006.01)

(52) U.S. Cl. ..................... 702/181; 706/21; 700/29; 700/51

(58) Field of Classification Search ............ 702/181, 702/179, 187; 700/29, 47, 48, 51; 703/2; 709/224; 706/14, 15, 20, 21

See application file for complete search history.

(56) References Cited

U.S. PATENT DOCUMENTS

| | | | | |
|---|---|---|---|---|
| 5,133,046 A | * | 7/1992 | Kaplan | 706/52 |
| 6,076,083 A | * | 6/2000 | Baker | 706/52 |
| 6,266,624 B1 | * | 7/2001 | Deco et al. | 702/73 |
| 6,272,480 B1 | * | 8/2001 | Tresp et al. | 706/44 |
| 6,606,657 B1 | * | 8/2003 | Zilberstein et al. | 709/224 |
| 2002/0124075 A1 | * | 9/2002 | Venkatesan | 709/224 |
| 2003/0018636 A1 | * | 1/2003 | Chi et al. | 707/6 |
| 2003/0028631 A1 | * | 2/2003 | Rhodes | 709/224 |
| 2003/0033253 A1 | * | 2/2003 | Rhodes | 705/52 |
| 2003/0033403 A1 | * | 2/2003 | Rhodes | 709/224 |

OTHER PUBLICATIONS

Briegel et al., "Robust Neural Network Online–Learning in Time–Variant Regression Models", IEEE, 1999.*
Hollmen et al., "A Self–Organizing Map for Clustering Probablistic Models", IEEE, 1999.*
Ormoneit et al., "Averaging, Maximum Penalized Likelihood and Bayesian Estimation for Improving Mixture Probability Density Estimates", IEEE, 1998.*
Taniguchi et al., "Fraud Detection in Communication Networks Using Neural and Probabilistic Methods", IEEE, 1998.*

* cited by examiner

*Primary Examiner*—Patrick J Assouad
(74) *Attorney, Agent, or Firm*—Finnegan, Henderson, Farabow, Garrett & Dunner, LLP

(57) ABSTRACT

The invention relates to a method and a system for detecting at least one partial model of a model pertaining to a system. A state of the system is described by state variables. At least on e of the state variables is a discrete state variable. Several value sets of the state variables are detected. A probability distribution for the state variables is detected by using the sets. The partial model of the system is detected using the sets and the probability distribution of the state variables and a statistical learning method. The partial model describes the system under the condition of the probability distribution for the state variables.

23 Claims, 6 Drawing Sheets

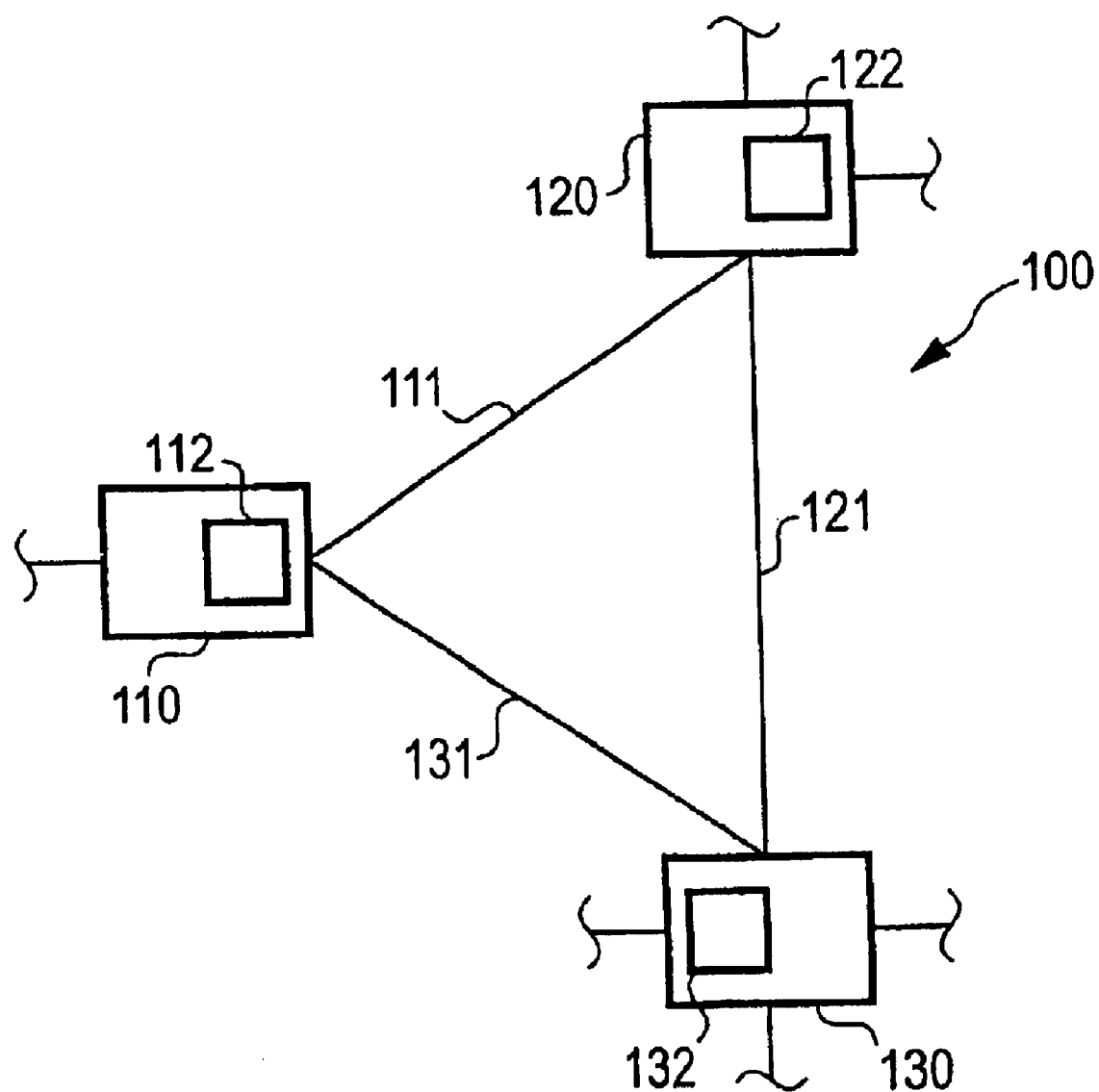

FIG 2

Logfile

210 Session or Access 1

139.23.185.150 - [29/Jun/1999:09:14:03+0200] "GET /fachl_infos/techn_abt/se/se3/se3_homepage/home.html" "Mozilla/4.5 [de]C-CCK-MCD FS SBS (WinNT; I)" GET "http://www.zt.siemens.de/fachl_infos/techn_abt/se/se3/se3_homepage/images/animation/ztse3_logoanim3.gif HTTP/1.0" 304 0 /fachl_infos/techn_abt/se/se3/se3_homepage/images/animation/ztse3_logoanim3.gif- "HTTP/1,0"...

210 Session or Access 2

139.23.185.151 - [30/Jun/1999:09:14:03+0200] "GET /fachl_infos/techn_abt/se/se3/se3_homepage/home.html" "Mozilla/4.5 [de]C-CCK-MCD FS SBS (WinNT; I)" GET "http://www.zt.siemens.de/fachl_infos/techn_abt/se/se3/se3_homepage/images/animation/ztse3_logoanim3.gif HTTP/1.0" 304 0 /fachl_infos/techn_abt/se/se3/se3_homepage/images/animation/ztse3_logoanim3.gif- "HTTP/1,0"...

210 Session or Access 3

139.23.185.152 - [01/Juli/1999:09:14:03+0200] "GET /fachl_infos/techn_abt/se/se3/se3_homepage/home.html" "Mozilla/4.5 [de]C-CCK-MCD FS SBS (WinNT; I)" GET "http://www.zt.siemens.de/fachl_infos/techn_abt/se/se3/se3_homepage/images/animation/ztse3_logoanim3.gif HTTP/1.0" 304 0 /fachl_infos/techn_abt/se/se3/se3_homepage/images/animation/ztse3_logoanim3.gif- "HTTP/1,0"...

210 Session or Access 4

139.23.185.153 - [02/Juli/1999:09:14:03+0200] "GET /fachl_infos/techn_abt/se/se3/se3_homepage/home.html" "Mozilla/4.5 [de]C-CCK-MCD FS SBS (WinNT; I)" GET "http://www.zt.siemens.de/fachl_infos/techn_abt/se/se3/se3_homepage/images/animation/ztse3_logoanim3.gif HTTP/1.0" 304 0 /fachl_infos/techn_abt/se/se3/se3_homepage/images/animation/ztse3_logoanim3.gif- "HTTP/1,0"...

METHOD AND SYSTEM FOR MODELING A SYSTEM

CROSS REFERENCE TO RELATED APPLICATIONS

This application is based on and hereby claims priority to German Application No. 100 09 344.2 filed on Feb. 28, 2000, the contents of which are hereby incorporated by reference.

BACKGROUND OF THE INVENTION

1. Field of the Invention

The invention relates to a determination of a model of a system, which model includes plural partial models.

2. Description of the Related Art

A determination of such a model is known from Bartholomew et al., Latent Variable Models and Factor Analysis, Charles Griffin, 1987. In this model with partial models (a so-called statistical probability model with a hidden variable y), a probability distribution P for a state x, which state x is described by continuous state quantities $x_i$ with $x_i \in R$, is described by:

$$P(x \mid \Theta) \equiv \sum_j P(x \mid y, \Theta) P(y \mid \Theta), \quad (1)$$

wherein $\Theta$ denotes a parameter of the model, i denotes an index for a state quantity, j denotes the number of the partial models, P(a|b) denotes a conditional probability of a variable a under the condition of a variable b, and $$\sum_j (\ldots)$$

denotes a summation over the j partial models.

In this model, the probability distribution $P(x|y,\Theta)$ of a partial model j is described by using a Gaussian distribution of the form $$P(x|y, m_y, \sigma) \propto \exp\{1/2^2\} \quad (2)$$

where $m_y$ denotes a mean, $\sigma$ denotes a variance, exp( ... ) denotes an exponential function, and P(a|b) denotes a conditional probability of a variable a under the condition b.

The model known from Bartholomew et al. is trained in a training phase so that state quantities are determined on a real system at predetermined times k, and the state quantities for one of the predetermined times k are respectively combined to a training datum. A plurality of such training data form a training data set.

The model is trained with the training data set. An overview of different training methods is likewise to be found In Bartholomew et al. and Tanner et al., Tools for Statistical Inference, Springer, 1996.

In the training phase, usually the following cost function L, a logarithmic likelihood, is minimized:

$$L(\Theta) = \sum_i \log(P(x_k \mid \Theta)) \quad (3)$$

where $x_k$ denotes a training datum, $\Theta$ a parameter to be matched in the training, log ( ... ) a logarithm function, and $P(x_k|\Theta)$ a conditional probability of the training datum $x_k$ under the condition of the parameter $\Theta$. The minimization of the logarithmic likelihood usually takes place by the use of an Expectation-Maximization method (EM algorithm), as is known from Tanner et al.

A system for the transmission of data between interconnected computers is known from Fundamentals for the World Wide Web, obtainable on Mar. 16, 1999 under: http:l/www.w3.org/. The components of this system are portions of a communication network, the so-called World Wide Web (WWW).

The communication network connects individual computers together such that the computers can exchange data according to a predetermined transmission protocol, the "Transmission Control Protocol (TCP)/Internet Protocol (IP)". In order to make possible a uniform processing of data, many data are present in a uniform format, the so-called Hypertext Markup Language (HTML) format.

It is furthermore known from Fundamentals for the World Wide Web to search for given data on the WWW using a WWW browser, and to display these data on a monitor. Such a WWW browser and a computer program implementing the WWW browser are known from Fundamentals for the World Wide Web.

These data can be transmitted in the context of a service which can be requested by a computer on the communication network. Such a service is, for example, a provision of information. An individual computer (user) can then request the service from another individual computer (server) over the communication network. In the context of the service, data are transmitted between the user and the server over the communication network.

It is furthermore known from Fundamentals for the World Wide Web that a computer which makes data available on the communication network and from which data can be requested is such a server.

A communication between a user and a server in which the user requests a service from the server and the server fulfills this request will be termed a session. Correspondingly, a communication between a user and a server on the WWW is termed an Internet session. In a user's Internet session, an item of information which describes the Internet session is stored at the selected server in a so-called "log file". The information includes, for example, an identification of the user and a duration of the Internet session. Such an Internet session, described by the information, can be interpreted as a state of an "internet session" system. The information would in this case contain state quantities of the system.

SUMMARY OF THE INVENTION

An aspect of the invention is to provide a method and a system with which a model with partial models of a system, for example of the system "Internet session", can be determined, which model describes the system with better accuracy than in the method described above.

In the method of determination of at least one partial model of a model of a system, wherein a state of the system is described by state quantities and at least one state quantity is a discrete state quantity, plural sets of values of the state quantities are determined. A probability distribution for the state quantities is determined from the sets. The partial model of the system is determined using the sets and the probability distribution for the state quantities, and using a statistical learning method; the partial model describes the system under the precondition of the probability distribution for the state quantities.

The system for the determination of at least one partial model of a model of a system, wherein a state of the system is described by state quantities and at least one state quantity is a discrete state quantity, has a processor which is set up such that plural sets of values of the state quantities can be determined, a probability distribution for the state quantities can be determined from the sets, using the sets and the probability distribution for the state quantities, and using a statistical learning method, the partial model of the system can be determined; the partial model describes the system under the precondition of the probability distribution for the state quantities.

The system is particularly suitable for carrying out the method according to the invention or of one of Its developments explained hereinafter. The developments described hereinafter relate both to the method and also to the system. The invention and the developments described hereinafter can be implemented both in software and also in hardware, for example, by using a special electrical circuit.

Furthermore, an Implementation of the invention or of a development described hereinafter is possible by a computer-readable memory medium, on which a computer program is stored which controls a processor to execute a method according to the invention or development.

In a development, the model Includes plural partial models. Also, all the state quantities can be discrete state quantities.

In an embodiment, the probability distribution is a multinomial distribution or a binomial distribution.

In a development, a characteristic set of values of the state quantities is determined, the probability distribution for the state quantities having an extremum for at least one characteristic set. The extremum can be a maximum.

Furthermore, a semantic designation can be determined for the characteristic set. In an embodiment, plural characteristic sets are determined.

The at least one discrete state quantity can be determined by the truncation of a continuous state quantity.

For an improvement of the model, it is appropriate to determine a measure of a statistical uncertainty for the model. The measure of a statistical uncertainty, for example, a conditioned entropy, can be taken into account in the statistical learning process. In such a case, only such a partial model is learned in the statistical learning process which has a small measure of the statistical uncertainty.

In an embodiment, the model is a Bayesian network.

A logarithmic likelihood can be determined in the statistical learning process. An expectation maximization method can also be carried out in the statistical learning process.

In a development, a state of the system is determined by a measurement of state quantities or a presetting of state quantities. The embodiment can be used for a prognosis of a state of a system. In the prognosis, only partial state quantities of a set of state quantities are determined and, using the model and the partially determined state quantities, further state quantities of this set are determined.

In a development, the system is defined as an Internet access. In this case, the development can be used for an analysis of plural Internet accesses.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIG. 1 is a block diagram of a communication system according to a first embodiment example;

FIG. 2 shows a Web log file with information about accesses of different users to a Web page;

DETAILED DESCRIPTION OF THE PREFERRED EMBODIMENT

Figure 3:
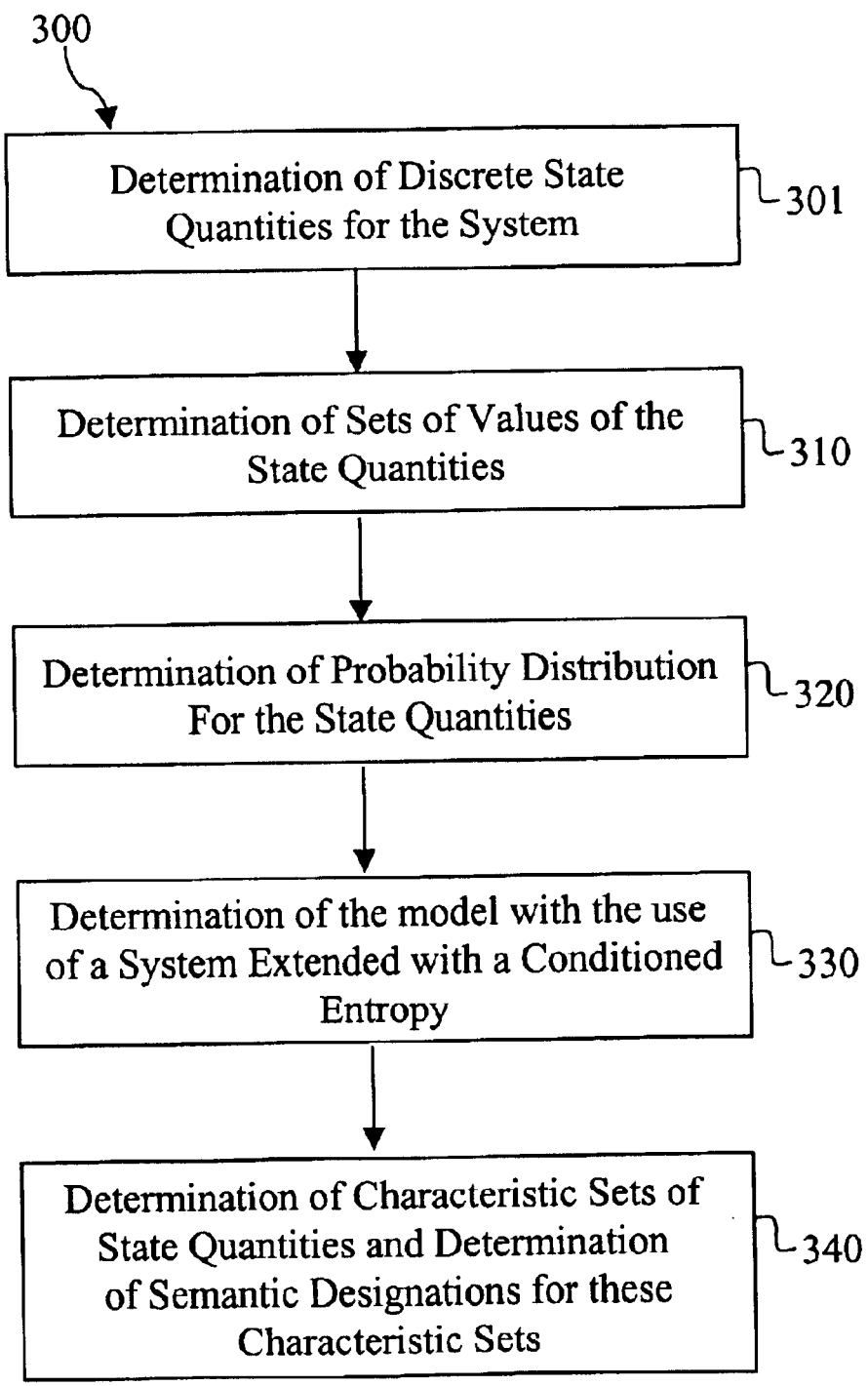
FIG. 3 is a flowchart for modeling of an "Internet session" system according to a first embodiment example.

Reference will now be made in detail to the preferred embodiments of the present invention, examples of which are illustrated in the accompanying drawings, wherein like reference numerals refer to like elements throughout.

Embodiment Example: Analysis of Internet Sessions

FIG. 1 shows schematically a structure of a communication network 100, a so-called World Wide Web (WWW), as described in Bartholomew et al. In the communication network 100, individual computers 110, 120, 130 are connected by connections 111, 112, 113, over which data can be transmitted. The computer 110 and the computer 120 are so-called user computers, i.e., a user can use in the WWW information which is offered in the WWW by using such a user computer. The computer 130 is a so-called server computer, which offers information in the WWW. Each user computer 110, 120 has a respective memory 112,122 in which a software program, a so-called WWW browser, as described in Bartholomew et al., is memorized.

Using such a WWW browser, a user computer can search in the WWW for given information, transfer found information to itself, and display the transmitted information on a monitor. A communication between a user and a server, in which the user requests a service from the server and the server fulfills this request, is termed a session or an access. In each session of a user, an item of information which describes the respective session is memorized at the server used in a so-called "log file" in a memory 132. In FIG. 2, such a log file 200 of a server is shown schematically; in it, information of four sessions 210, 220, 230, 240 of four different users is memorized.

An item of Information regarding a session of a user respectively includes the following partial items of information:

an indication of the respective user 250, an indication of the time of the respective session 251, an indication of a starting page of the respective session 252, an indication of the duration of the respective session, an indication of a reference of the starting page, an indication of a number of pages searched during the respective session.

It should be mentioned that the above listing of the partial information of an information is not to be understood as definitive. An item of information can also include further partial items of information.

For modeling an "Internet session" system, variables of the "Internet session" system are defined using these partial items of information, and describe an Internet session as comprehensively as possible (see FIG. 3, method step 301). A continuing analysis and modeling of Internet sessions is then carried out using the model. FIG. 3 shows method step 300, which is carried out in modeling the "Internet session" system:

- a first method step 301, in which discrete state quantities, for example user class or number of sessions, are determined for the system,
- a second method step 310, in which sets of values of the state quantities are determined,
- a third method step 320, in which a probability distribution for the state quantities is determined,
- a fourth method step 330, in which the model of the system is determined, a target function extended with a conditioned entropy being used in the determination,
- a fifth method step 340, in which characteristic sets of the state quantities are determined, and the characteristic sets are allocated a respective semantic designation.

The modeling of the "Internet session" system is explained hereinbelow, reference being made to the respective method step 300 in FIG. 3. It is shown how the model is used to describe the behavior of users on the Internet, to extract a typical scenario of users, and to determine users' typical, recurring behavior patterns.

For the case that a variable of the "Internet session" system is a continuous variable, for example, the duration of a session, this variable is discretized, i.e., a continuous range of values of the variable is divided into regions, and these regions are respectively allocated an index, for example up to 1 minute: index 1; 1–10 minutes: index 2; 10 minutes to 1 hour, index 3; and more than an hour: index 4 (see FIG. 3, method step 301).

The defined and if necessary discretized variables of the "internet session" system are:

- user class (local employee; corporate management; . . . ; other user),
- number of sessions in time period considered (one visit; two through five visits; 6–15 visits; more than 15 visits),
- starting time of a session (before 9:00 a.m.; between 9:00 and 11:00 a.m.; . . . )
- starting page,
- duration of the session,
- reference to the starting page,
- number of pages visited,
- home page (visited/not visited)
- news (visited/not visited).

It is emphasized that this enumeration of variables is not to be taken as exhaustive. Further variables can certainly be defined which describe the "Internet session" system. The variables are combined Into a so-called session vector, the discrete variables being components of the session vector.

For the modeling of the "Internet session" system, a statistical probability model P with a hidden variable y, of the Bayesian network type as described in Bartholomew et al., is used. The statistical probability model P which is used can be described as follows:

$$P(x \mid \Theta) \equiv \sum_j P(x \mid y, \Theta) P(y \mid \Theta), \quad (4)$$

wherein $\Theta$ denotes a parameter of the model, i denotes an index of a state quantity, j denotes the number of the partial models, P(a|b) denotes a conditional probability of a variable a under the condition of a variable b, and $$\sum_j (\ldots)$$

denotes a summation of j partial models of the statistical probability model P.

The number j of the partial models of the statistical probability model P can be freely predetermined. In this case j=20 partial models is chosen. Since the state x, in this case the session vector x, has only discrete variables, a natural parametrization is to be chosen, i.e., the parameters $\Theta$ of the statistical probability model correspond to elements of a probability table $P(x_i|y, \Theta)$. Graphically this means that in this case the probability distribution $P(x|y, \Theta)$ is described using a multinomial distribution.

The statistical probability model P (4) is trained In a training phase. For this purpose, session vectors are extracted from a predetermined training log file and are combined into a training data set (see FIG. 3, method step 310). The statistical probability model (4) is trained with the training data set (see FIG. 3, method step 320 and method step 330).

In the training phase, a modified cost function $L_{mod}(\Theta)$ is minimized; it is a logarithmic likelihood $L(\Theta)$ with an additional term $K(\Theta)$, which is coupled on by a Lagrange parameter $\lambda$ (see FIG. 3, method step 330):

$$L_{mod}(\Theta) = \sum_i \log(P(x_k \mid \Theta)) + \lambda K \Theta \quad (5)$$

where $x_k$ denotes a training datum, $\Theta$ a parameter to be adjusted in the training, log ( . . . ) a logarithm function, and $P(x_k|\Theta)$ a conditional probability of the training datum $x_k$ under the condition of the parameter. An average (negative) entropy $E(\Theta)$ is used as the additional term $K(\Theta)$, and is weighted with a prior $P(y|\Theta)$ (see FIG. 3, method step 320. The following holds:

$$E(\Theta) = \sum_y P(y \mid \Theta) \sum_x P(x \mid y, \Theta) \log P(x \mid y, \Theta) \quad (6)$$

The minimization of the modified cost function takes place using an optimizing method based on a expectation maximization method (EM algorithm), as described in Tanner et al.

For this purpose, the following expression is optimized stepwise by changing the parameter $\Theta$:

$$\Theta^{new} = \text{argmax}_\Theta \left\{ \sum_i \sum_y P(y \mid x_i, \Theta^{old}) \log P(x_i, y \mid \Theta) + \lambda E(\Theta) \right\} \quad (7)$$

where $\Theta^{old}$ denotes a parameter before an optimization step, $\Theta^{new}$ denotes a parameter after an optimization step . It is however mentioned in this regard that an unmodified cost function (a logarithmic likelihood $L(\Theta)$) can also be used in the training.

The trained statistical probability model is now used hereinafter in order to determine typical behavior patterns of Internet users, termed scenarios (see FIG. 3, method step 340). For this purpose, the conditional probabilities $P(x_i|y, \Theta)$ are determined and are analyzed in regard to a maximum deterministic probability distribution of the variables $x_i$. As a criterion for a maximum deterministic probability distribution, the Kullback-Leibler distance $$\sum_{x_i} Q(x_i)\log(Q(x_i)/P(x_i\,|\,y,\Theta)),$$

which is described in Cover et al., Elements of Information Theory, Wiley 1991, is used, where Q ( . . . ) denotes an empirical probability.

The probability distribution associated with the variables xi is rounded down or up here to 0% or 100%. The distributions rounded-down or—up are frozen, i.e., these distributions are no longer changed in the further course of the method. The training of the model is once again carried out as described. It is thereby ensured that within each partial model at least a few probability distributions of a variable $x_i$ have a deterministic structure and thus each partial model can be interpreted as a scenario.

Figure 6:
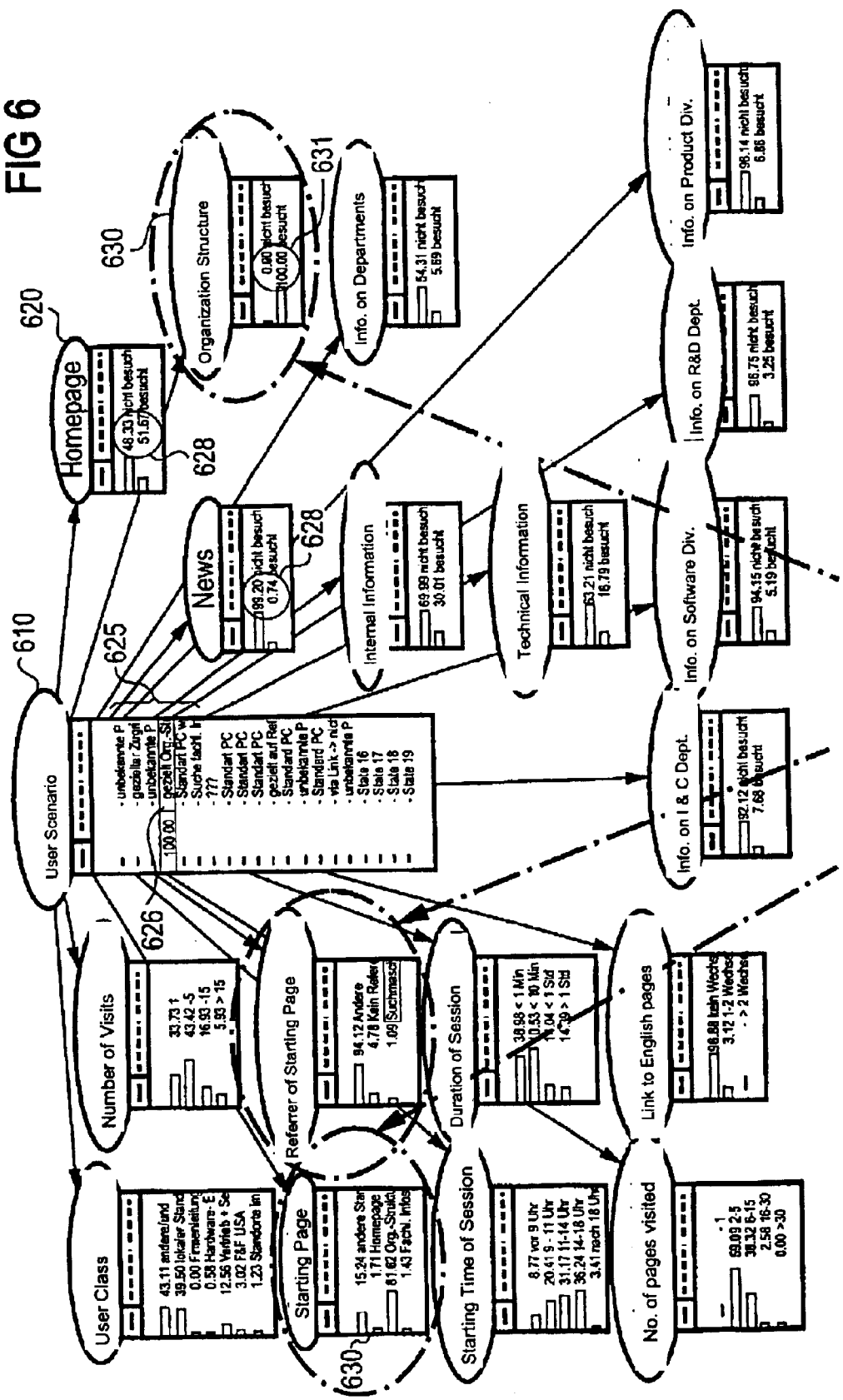
FIG. 6 is a bubble diagram of a statistical model which describes an access to a collection of Web pages, and in which user scenarios are shown.

It is shown in FIG. 6 how a "targeted organization structure" scenario is identified and named according to the above procedure. FIG. 6 shows schematically the hidden variable 610, "user scenario", with the partial models of the system 625. Furthermore in FIG. 6 there are shown the variables 620 of the "Internet session" system, for example, user categories and number of visits. FIG. 6 shows a selected partial model 626 and, for the selected partial model 626, the associated probability distributions 628 of the variables 620, determined using the trained model.

After processing the probability distributions with a method according to Kullback-Leibler, which is described in Cover et al., the variable "organization structure" 630 has a maximal deterministic distribution 631. This maximal deterministic distribution 631 of the "organization structure" variable is thus characterizing for the selected partial model 626. Accordingly, the selected partial model receives a semantic designation "targeted organization structure". Other scenarios, for example, "standard PC", "targeted access", are determined corresponding to this procedure.

Figure 4:
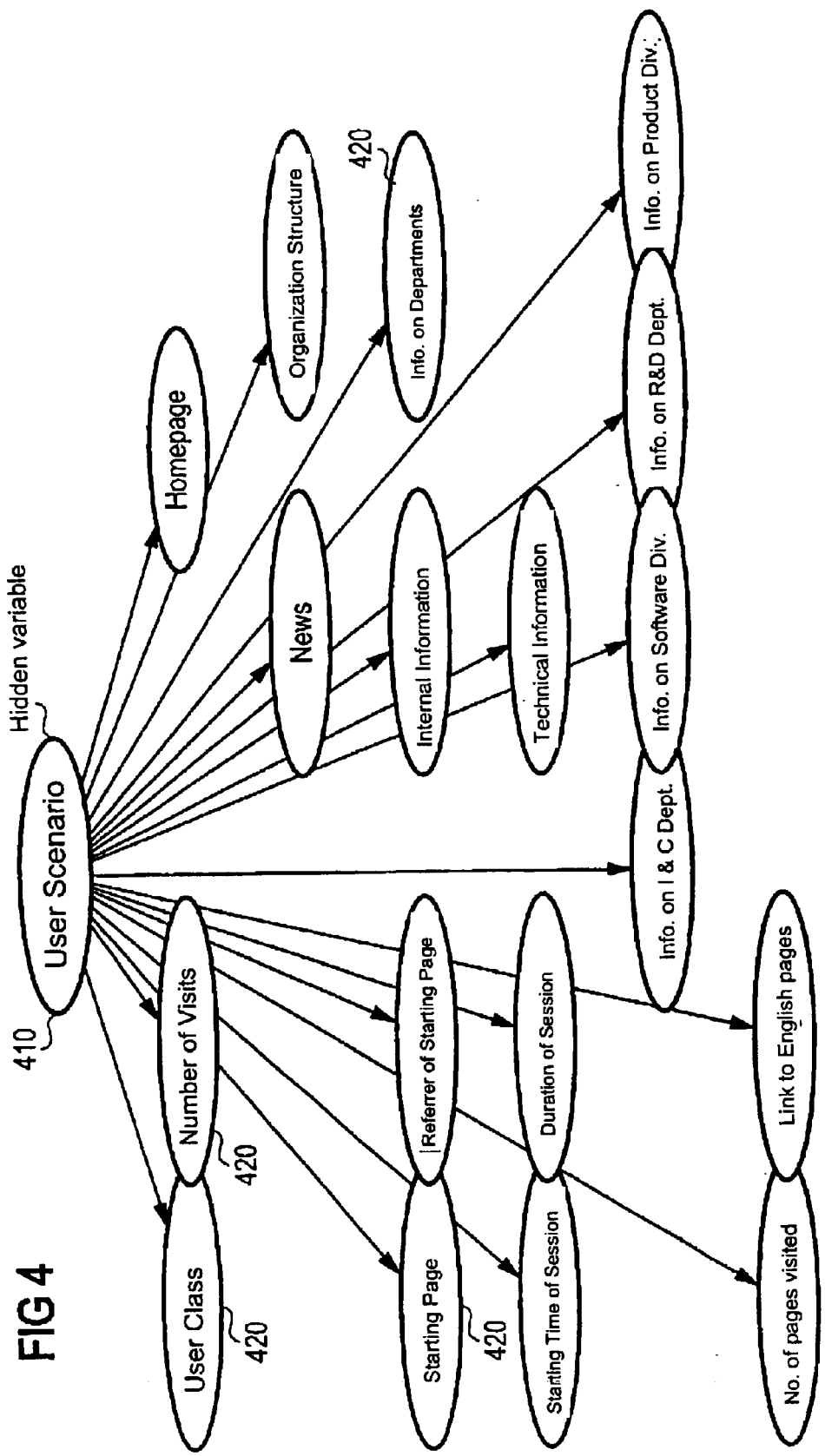
FIG. 4 is a bubble diagram of a statistical model which describes an access to a collection of Web pages.

The statistical probability model 400 with a hidden variable 410 is shown schematically in FIG. 4. FIG. 4 shows the hidden variable 410, which is allocated a semantic designation "user scenario". FIG. 4 also shows the variables 420 of the "Internet session" system, for example, "user class", "number of visits", "starting page", and "information on sections".

Figure 5:
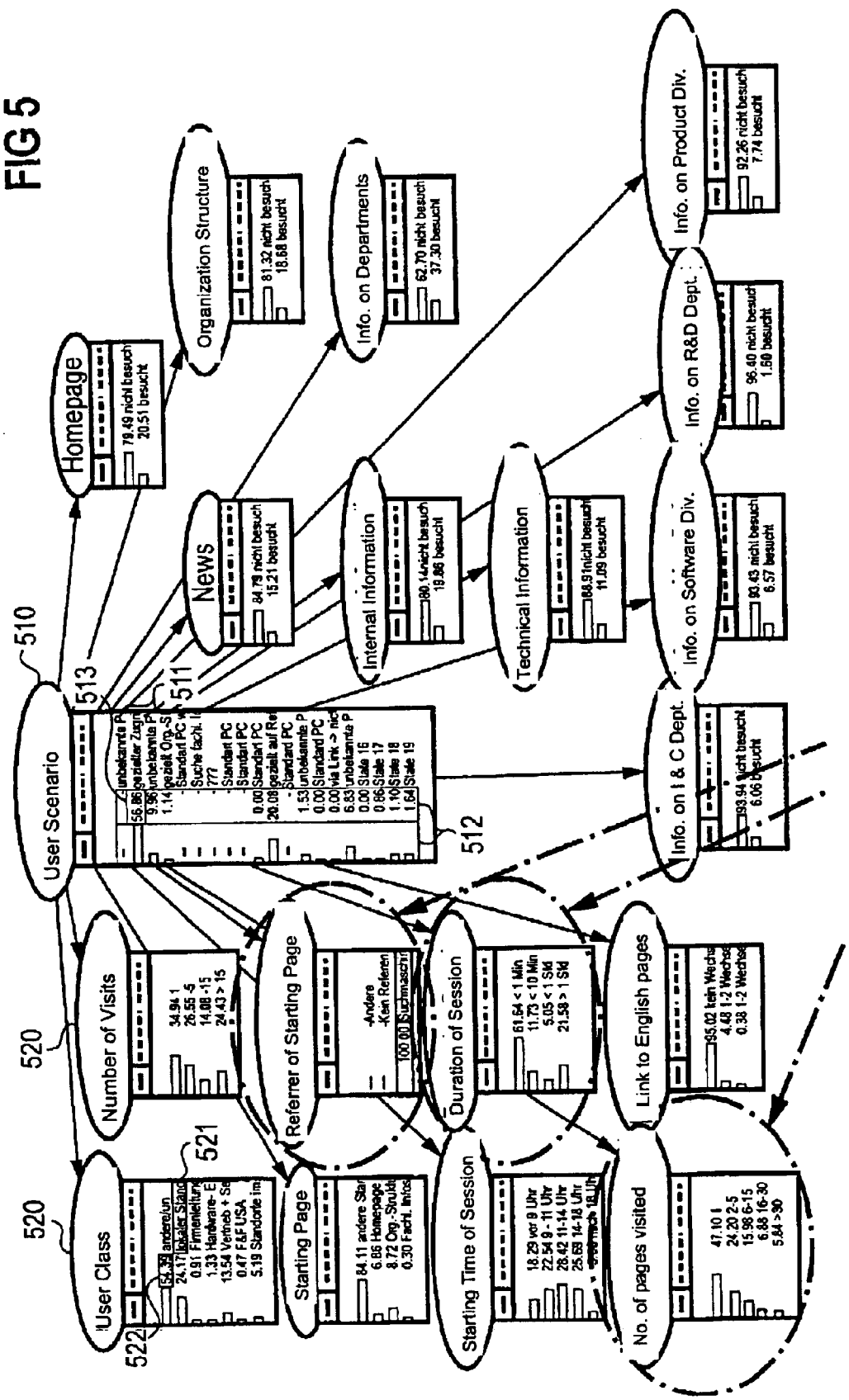
FIG. 5 is a bubble diagram of a statistical model which describes an access to a collection of Web pages, and in which user scenarios are shown.

A result 500 of an analysis of Internet sessions is shown in FIG. 5; in it, numerous different users have accessed an Internet page of a selected server. For this purpose, a log file of the chosen server was processed according to the above-described procedure. FIG. 5 shows the hidden variable 510 "user scenario" and the associated semantically designated scenarios 511, for example, targeted access, standard PC, unknown person.

A respective probability 512 is given for the scenarios 511. The probability 512 of a scenario 511 gives the frequency with which the scenario appeared in the Internet sessions stored in the log file.

FIG. 5 also shows the variables 520 of the "Internet session" system, for example, user classes, number of visits. For the variables 520 shown, there are respectively given the associated, discretized value regions 521. Furthermore, for each variable 520, a probability distribution 522 with which the respective variable 520 occurs in the Internet sessions memorized In the log file Is given.

It must however be emphasized that the described procedure is not limited to the modeling of the "Internet session" system. A model can be determined by the described procedure for any optional system, for example a chemical reactor, a traffic system, or a fault diagnosis system in a motor vehicle. In this case, other state quantities result, for example, the composition of a chemical material, a material concentration, a traffic density, or a traffic flow.

In the fault diagnosis system, the state quantities can be variables which describe an operational state of the motor vehicle or an electronics of the motor vehicle, for example, a speed, an engine torque, or an engine rpm. The hidden variable would in such a case describe fault states of the motor vehicle or fault scenarios of the motor vehicle, for example, "faults in the injection system". The procedure in the modeling of such a system is to be carried out corresponding to the above statements.

Variants of the embodiment example are described hereinbelow.

In a first variant of the embodiment example, a method based on a customary gradient-based method for the optimization of the parameter $\Theta$ is used in the training of the statistical probability model (4). For this purpose, an average (negative) entropy $E'(\Theta)$ is weighted with an 'empirical prior' $Q(y|\Theta)$:

$$E'(\Theta) = \sum_y Q(y\,|\,\Theta)\sum_x P(x\,|\,\Theta)\log P(x\,|\,y,\Theta) \qquad (8)$$

where there holds for $Q(y|\Theta)$:

$$Q(y\,|\,\Theta) = \frac{1}{K}\sum_i P(y\,|\,x_i,\Theta). \qquad (9)$$

The target function in the gradient-based method Is in this case the expression:

$$L_{mod}(\Theta) = \sum_i \log(P(x_i\,|\,\Theta)) + \lambda E'(\Theta) \qquad (10)$$

In a second variant of the embodiment example, a transformation is carried out in the training:

$$M(\Theta) = \sum_y \sum_x P(x,y\,|\,\Theta)\log \qquad (11)$$

where the transformed term is denoted by $M(\Theta)$. In this case, the following expression is optimized:

$$\Theta^{new} = \mathrm{argmax}_\Theta\left\{\sum_i\sum_y P(y\,|\,x_i,\Theta^{old})\log P(x_i,y\,|\,\Theta) + \lambda M\Theta\right\}. \qquad (12)$$

In a third variant of the embodiment example, an entropy $E(\Theta)$ with $$E(\Theta) = \sum_{x_i} P(x_i \mid y, \Theta) \log P(x_i \mid y, \Theta)$$

is used as a criterion for a maximally deterministic probability distribution.

the invention has been described in detail with particular reference to preferred embodiments-thereof and examples, but it will be understood that variations and modifications can be effected within the spirit and scope of the invention.

What is claimed is:

1. A method for determination of at least one partial model of a model of a system, a state of the system being described by state quantities, comprising:

determining sets of values of the state quantities, where at least one of the state quantities is a discrete state quantity;

determining a probability distribution for the state quantities from the sets; and determining the partial model of the system using the sets, the probability distribution for the state quantities and a statistical learning method, the partial model describing the system under the precondition of the probability distribution for the state quantities.

2. A method according to claim 1, wherein the model includes plural partial models.

3. A method according to claim 2, wherein all the state quantities are discrete state quantities.

4. A method according to claim 3, wherein the probability distribution is a multinomial distribution or a binomial distribution.

5. A method according to claim 4, wherein at least one characteristic set of values of the state quantities is determined and the probability distribution for the state quantities has an extremum for the at least one characteristic set.

6. A method according to claim 5, wherein the extremum is a maximum.

7. A method according to claim 6, wherein a semantic designation is determined for the characteristic set.

8. A method according to claim 7, wherein a plurality of characteristic sets are determined.

9. A method according to claim 8, further comprising determining the at least one discrete state quantity by discretization of a continuous state quantity.

10. A method according to claim 9, further comprising determining a measure of a statistical uncertainty for at least one partial model.

11. A method according to claim 10, wherein a measure of the statistical uncertainty Is taken into account in the statistical learning method.

12. A method according to claim 11, wherein the measure of the statistical uncertainty is taken into account such that only one such partial model is learned which has a small measure of the statistical uncertainty.

13. A method according to claim 12, wherein the measure of the statistical uncertainty is a conditional entropy.

14. A method according to claim 13, wherein the model is a Bayesian network.

15. A method according to claim 14, further comprising determining a logarithmic likelihood in the statistical learning method.

16. A method according to claim 15, further comprising carrying out an expectation maximization method in the statistical learning method.

17. A method according to claim 16, further comprising determining a state of the system by at least one of a measurement of state quantities and a presetting of state quantities.

18. A method according to claim 17, further comprising obtaining a prognosis of a state of the system using the model.

19. A method according to claim 18, wherein said obtaining the prognosis includes determining only partial state quantities of the set of state quantifies, and wherein said method further comprises determining state quantities of the set using the model and the partial state quantities.

20. A method according to claim 19, wherein the system is defined as an Internet access.

21. A method according to claim 19, further comprising analysis of a plurality of Internet accesses.

22. A system for determination of at least one partial model of a model of a system, a state of the system being described by state quantities, comprising:

a processor programmed to determine sets of values of the state quantities, where at least one of the state quantities is a discrete state quantity; to determine a probability distribution for the state quantities from the sets, and to determine the partial model of the system using the sets, the probability distribution for the state quantities and a statistical learning method, the partial model describing the system under the precondition of the probability distribution for the state quantities.

23. At least one computer readable medium storing at least one computer program for controlling a processor to execute a method for determination of at least one partial model of a model of a system, a state of the system being described by state quantities, said method comprising:

determining sets of values of the state quantities, where at least one of the state quantities is a discrete state quantity;

determining a probability distribution for the state quantities from the sets; and determining the partial model of the system using the sets, the probability distribution for the state quantities and a statistical learning method, the partial model describing the system under the precondition of the probability distribution for the state quantities.

* * * * *